(12) United States Patent
Laitinen et al.

(10) Patent No.: US 11,119,598 B2
(45) Date of Patent: Sep. 14, 2021

(54) PIEZZOELECTRIC TOUCH DEVICE

(71) Applicant: Aito BV, Amsterdam (NL)

(72) Inventors: Pauli Laitinen, Helsinki (FI); Jockum Lönnberg, Amsterdam (NL); Ferdinand Van Der Neut, Amsterdam (NL); Jari Heikki Antero Toropainen, Espoo (FI)

(73) Assignee: Aito BV, Amsterdam (NL)

( * ) Notice: Subject to any disclaimer, the term of this patent is extended or adjusted under 35 U.S.C. 154(b) by 73 days.

(21) Appl. No.: 16/308,095

(22) PCT Filed: Jun. 9, 2017

(86) PCT No.: PCT/EP2017/064125
§ 371 (c)(1),
(2) Date: Dec. 7, 2018

(87) PCT Pub. No.: WO2017/212027
PCT Pub. Date: Dec. 14, 2017

(65) Prior Publication Data
US 2019/0302948 A1    Oct. 3, 2019

Related U.S. Application Data

(60) Provisional application No. 62/347,608, filed on Jun. 9, 2016.

(51) Int. Cl.
*G06F 3/041* (2006.01)
*G06F 3/01* (2006.01)
(Continued)

(52) U.S. Cl.
CPC ......... *G06F 3/0414* (2013.01); *B06B 1/0666* (2013.01); *G06F 3/016* (2013.01);
(Continued)

(58) Field of Classification Search
CPC ...... G06F 3/0414; G06F 3/016; B06B 1/0666
See application file for complete search history.

(56) References Cited

U.S. PATENT DOCUMENTS 5,854,625 A * 12/1998 Frisch ................... G06F 3/0414
345/173
6,294,878 B1 * 9/2001 Murata ................. H01L 41/107
310/311
(Continued)

FOREIGN PATENT DOCUMENTS

| WO | WO 2014/128640 A2 | 8/2014 |
|---|---|---|
| WO | WO 2014/141336 A1 | 9/2014 |
| WO | WO 2015/019329 A1 | 2/2015 |

OTHER PUBLICATIONS

International Search Report for corresponding International Patent Application No. PCT/EP2017/064125 dated Aug. 29, 2017, 3 pages.
(Continued)

*Primary Examiner* — Nitin Patel
*Assistant Examiner* — Robert M Stone
(74) *Attorney, Agent, or Firm* — Merchant & Gould P.C.

(57) ABSTRACT

A piezoelectric touch device is provided. According to a first aspect, a piezoelectric touch device comprises: a conductive support structure comprising an inseparable section as a bridge separated by a first opening; a piezoelectric element configured to provide a touch sensing and a haptic feedback; connection pads configured to form an electrically connected circuit for the piezoelectric element, wherein the piezoelectric element is electrically connected to the connection pads, and wherein the bridge comprises one of the connection pads and the conductive support structure comprises another of the connection pads; a second opening next to the another connection pad allowing the piezoelectric element to bend freely. The piezoelectric touch device for
(Continued)

touch sensing and haptic feedback may be consequently manufactured with an improved manufacturability.

19 Claims, 10 Drawing Sheets

(51) Int. Cl.
    *H01L 41/08*     (2006.01)
    *B06B 1/06*     (2006.01)
    *H01L 41/047*     (2006.01)
    *H01L 41/053*     (2006.01)

(52) U.S. Cl.
    CPC ........ *H01L 41/0475* (2013.01); *H01L 41/053* (2013.01); *H01L 41/0825* (2013.01); *G06F 2203/04103* (2013.01)

(56) References Cited

U.S. PATENT DOCUMENTS

| | | | |
|---|---|---|---|
| 7,109,976 B2* | 9/2006 | Cobian | G06F 3/0414 345/173 |
| 7,903,090 B2* | 3/2011 | Soss | G06F 3/04142 345/173 |
| 8,144,453 B2* | 3/2012 | Brown | G06F 1/1656 361/679.21 |
| 8,260,377 B2* | 9/2012 | Paleczny | H04M 1/0266 455/575.1 |
| 8,742,647 B2 | 6/2014 | Fluhrer | |
| 9,274,660 B2* | 3/2016 | Bernstein | G06F 3/0416 |
| 10,088,937 B2* | 10/2018 | Hoen | G01L 1/22 |
| 10,478,858 B2* | 11/2019 | Lasiter | G06F 3/0412 |
| 10,831,292 B2* | 11/2020 | Campbell | G06F 3/041 |
| 2002/0079787 A1* | 6/2002 | Pohl | H05K 3/321 310/348 |
| 2002/0149571 A1* | 10/2002 | Roberts | G06F 3/04142 345/174 |
| 2003/0206202 A1* | 11/2003 | Moriya | G06F 3/0488 715/846 |
| 2006/0250377 A1* | 11/2006 | Zadesky | G06F 3/03548 345/173 |
| 2008/0143559 A1* | 6/2008 | Dietz | G06F 3/017 341/20 |
| 2009/0051246 A1* | 2/2009 | Mueller | H01L 41/053 310/313 R |
| 2010/0013574 A1* | 1/2010 | Huang | B06B 1/0292 333/186 |
| 2010/0156843 A1* | 6/2010 | Paleczny | G06F 3/041 345/174 |
| 2011/0051334 A1* | 3/2011 | Griffith | G06F 3/03547 361/679.01 |
| 2011/0053653 A1* | 3/2011 | Tho | H04M 1/0249 455/566 |
| 2011/0120843 A1* | 5/2011 | Wunnicke | H01L 41/094 200/181 |
| 2011/0187667 A1* | 8/2011 | Kaida | G06F 3/0416 345/173 |
| 2012/0206014 A1* | 8/2012 | Bibl | H01L 41/09 310/331 |
| 2012/0240672 A1* | 9/2012 | Frey | H01L 41/053 73/146.5 |
| 2012/0275086 A1* | 11/2012 | Pasquero | G06F 1/1626 361/679.01 |
| 2013/0044049 A1* | 2/2013 | Biggs | H01L 41/083 345/156 |
| 2013/0086997 A1 | 4/2013 | Tanhua et al. | |
| 2013/0294201 A1* | 11/2013 | Hajati | H01L 41/047 367/138 |
| 2013/0321321 A1* | 12/2013 | Hiraoka | G06F 1/1626 345/173 |
| 2014/0055394 A1* | 2/2014 | Park | G06F 3/016 345/173 |
| 2014/0070667 A1* | 3/2014 | Oh | B06B 1/0644 310/326 |
| 2014/0082490 A1* | 3/2014 | Jung | G06F 3/016 715/702 |
| 2014/0092064 A1* | 4/2014 | Bernstein | G06F 1/1692 345/174 |
| 2014/0160050 A1* | 6/2014 | Olien | G06F 3/016 345/173 |
| 2014/0306914 A1* | 10/2014 | Kagayama | G06F 3/03547 345/173 |
| 2015/0091414 A1 | 4/2015 | Lönnberg et al. | |
| 2015/0102947 A1* | 4/2015 | Chung, II | G06F 3/0202 341/27 |
| 2015/0165479 A1* | 6/2015 | Lasiter | G06F 3/0412 310/322 |
| 2015/0212109 A1* | 7/2015 | Kang | G01L 1/16 73/662 |
| 2015/0277735 A1* | 10/2015 | Gibson | H04R 29/002 715/716 |
| 2015/0364668 A1* | 12/2015 | Jung | H01L 41/0926 310/317 |
| 2016/0023245 A1* | 1/2016 | Zadesky | G06F 1/163 310/334 |
| 2016/0027988 A1* | 1/2016 | Nagahata | B41J 2/1646 347/70 |
| 2017/0033275 A1* | 2/2017 | Choi | H01L 41/0475 |
| 2017/0128983 A1* | 5/2017 | Horsley | H01L 41/0475 |
| 2018/0242087 A1* | 8/2018 | Miyoshi | H04R 3/02 |

OTHER PUBLICATIONS

Written Opinion of the International Searching Authority for corresponding International Patent Application No. PCTEP2017/064125 dated Aug. 29, 2017, 7 pages.

\* cited by examiner

PIEZZOELECTRIC TOUCH DEVICE

This application is a National Stage Application of PCT/EP2017/064125, filed 9 Jun. 2017, which claims benefit of U.S. Provisional Patent Application Ser. No. 62/347,608, filed 9 Jun. 2016 and which applications are incorporated herein by reference. To the extent appropriate, a claim of priority is made to each of the above disclosed applications.

TECHNICAL FIELD

The present invention relates generally to touch user interfaces of electronic equipment and more specifically it relates to a piezoelectric touch device with both sensing and tactile feedback.

BACKGROUND

Piezoelectric elements can be used for touch sensors and also actuators for providing tactile feedback. The most economically viable elements typically consist of a single sheet of piezoelectric material (PZT) cemented to a thin metal disc. This element produces effectively an electric charge while bending, which can be used for touch detection when the element is mounted below a touch surface. Same piezoelectric element can also produce a bending actuation when sufficiently high voltage is applied to it, which can be used to provide haptic feedback to users. In order to provide sufficiently strong tactile feedback by vibrating the device surface, the piezoelectric elements must be mounted in a way, which enables maximal vibration efficiency and provides efficient mechanical contact to mediate the vibration to the device surface. This means that the piezo element cannot be clamped.

When using the most economically viable piezoelectric elements, the mounting method has been a challenge, as the element requires reliable two-sided electrical and mechanical contact. There has been several solutions proposed as US2013086997, WO2015019329 for a reliable touch sensing assembly and also solutions regarding improving the haptic feedback exist, like US2015091414. Also there is a solution proposed for automated assembly by design of a single sided contact described in U.S. Pat. No. 8,742,647. All the solutions are based on a piezoelectric element assembly on a printed circuit board or screen printed conductors on polymer film. However some of the proposed solutions provide reliable contacts, but resulting too stiff device or clamped mounting of piezoelectric element for enable strong enough tactile feedback. Some of the proposed solutions provide a structure for enabling haptic feedback, but the mounting of the element is too complex for automated manufacturing.

Yet another challenge is to ensure mechanical and electrical contact while the piezoelectric element is in its highest actuation mode, where there is a strong acceleration and forces are produced in very short moments.

SUMMARY

This summary is provided to introduce a selection of concepts in a simplified form that are further described below in the detailed description. This summary is not intended to identify key features or essential features of the claimed subject matter, nor is it intended to be used to limit the scope of the claimed subject matter.

It is an object to provide a piezoelectric touch device. The object is achieved by the features of the independent claims. Further implementation forms are provided in the dependent claims, the description and the figures.

According to a first aspect, a piezoelectric touch device comprises: a conductive support structure comprising an inseparable section as a bridge separated by a first opening; a piezoelectric element configured to provide a touch sensing and a haptic feedback; connection pads configured to form an electrically connected circuit for the piezoelectric element, wherein the piezoelectric element is electrically connected to the connection pads, and wherein the bridge comprises one of the connection pads and the conductive support structure comprises another of the connection pads; a second opening next to the another connection pad allowing the piezoelectric element to bend freely. The piezoelectric touch device for touch sensing and haptic feedback may be consequently manufactured with an improved manufacturability.

In a possible implementation of the device, the second opening comprises a lateral opening with respect to the piezoelectric element.

In another possible implementation of the device, the connection pads are configured to both a mechanical support to the piezoelectric element and to the electric connection for electrically connect to the piezoelectric element.

In another possible implementation of the device, the connection pads are configured on a same side of the piezoelectric element; or the connection pads are configured on different sides of the piezoelectric element.

In another possible implementation of the device, further including a third opening configured to an opposite side of the piezoelectric element than the first opening.

In another possible implementation of the device, dimensions of the piezoelectric element and openings are configured such that a piezoelectric element can be locally bent.

In another possible implementation of the device, a diameter of the first opening is 5-30 millimetre.

In another possible implementation of the device, the piezoelectric element is configured to slide with respect to at the connections pads of the conductive support structure.

In another possible implementation of the device, the piezoelectric element is configured in a bent stage without a pressure applied on a surface of the device or without a drive signal to the piezoelectric element.

In another possible implementation of the device, further including a back support configured to partly establish the first or the third opening; or a back support is configured to provide a support to the piezoelectric element.

In another possible implementation of the device, the support is configured elastic.

In another possible implementation of the device, the piezoelectric element is electrically connected to the connection pads by a pressure provided by the back support.

In another possible implementation of the device, a design of the openings is configured to effect on an audio output; or a material and/or design of the back support is configured to effect an audio output.

In another possible implementation of the device, the conductive support structure comprises a conductive foil, a printed circuit board having conductive layers, or a polymer film having conductive layers.

In another possible implementation of the device, the piezoelectric element comprises a piezoelectric layer and a conductive disk.

According to a second aspect, a method of manufacturing the piezoelectric touch device according to the first aspect is provided.

In possible implementations of the second aspect, a surface mounted technology, a screen printing, UV curing or heat is used to manufacture piezoelectric touch device.

Many of the attendant features will be more readily appreciated as they become better understood by reference to the following detailed description considered in connection with the accompanying drawings.

DESCRIPTION OF THE DRAWINGS

The present description will be better understood from the following detailed description read in light of the accompanying drawings, wherein.

Figure 1:
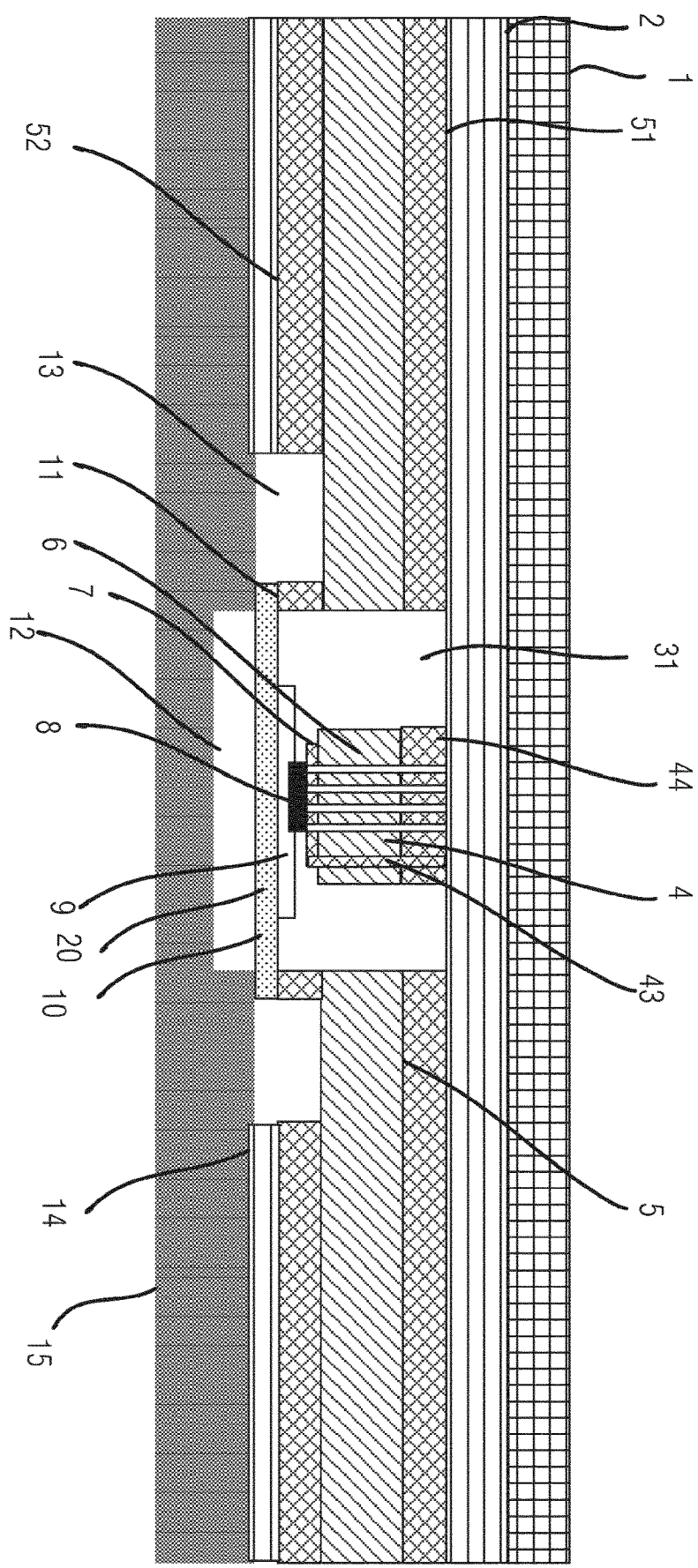
FIG. 1 illustrates a schematic representation of a cross section of a piezoelectric touch device under surface of the device according to an embodiment.

Like references are used to designate like parts in the accompanying drawings. According to an embodiment, a list of reference numerals used is illustrated as follows:
1 device surface;
2 adhesive;
3 conductive layer;
31 opening;
4 tongue/bridge;
5 printed circuit board;
6 hole;
7 connection pad;
8 conductive adhesive;
9 piezoelectric layer;
10 metal disc;
11 connection pad;
12 opening;
13 opening;
14 adhesive;
15 back support;
20 piezoelectric element;
21 adhesive;
31 opening;
32 opening;
41 canvas;
42 opening;
43 via;
44 conductive layer;
51 conductive layer;
52 conductive layer;
151 elastic support; and
152 support pad.

DETAILED DESCRIPTION

The detailed description provided below in connection with the appended drawings is intended as a description of the embodiments and is not intended to represent the only forms in which the embodiment may be constructed or utilized. However, the same or equivalent functions and structures may be accomplished by different embodiments.

Accordingly, it is desirable to create a piezoelectric touch device which has both reliable mechanical and electrical connections, mechanics with reduced damping and clamping of the piezoelectric element to provide efficient actuation and energy transfer to the device surface, as well as the device has a simple assembly enabling automated mass manufacturing.

An embodiment relates to a piezoelectric touch device for touch sensing and haptic feedback with improved manufacturability. The piezoelectric touch device may be capable to provide reliable touch sensing and strong enough haptic feedback. The piezoelectric touch device can be mounted under device surface. A device comprises a conductive support layer comprising an inseparable section as a bridge separated by a first opening. Furthermore, a piezoelectric element is configured to provide a touch sensing and a haptic feedback in the device. Connection pads are configured to form an electrically connected circuitry for the piezoelectric element. The piezoelectric element is electrically connected to the connection pads. The bridge comprises one of the connection pads and the conductive support layer comprises another of the connection pads. A second opening next to another connection pad allows the piezoelectric element to bend. The piezoelectric element may be allowed to bend freely without clamping. The second opening may be lateral with respect to the piezoelectric element and/or the edge of the piezoelectric element.

Although embodiments have been described relating to one piezoelectric component, it should be understood that the number of piezoelectric components can be varied, and is not limited. Similarly the embodiments have been described based on a single circular piezoelectric layer cemented to a thin metal disc to form a disc shaped piezoelectric element. It should be understood that other kind of shapes may be used as well. The scope or the embodiments is not limited to a shape of neither piezoelectric element nor the number of the piezoelectric layers.

Referring to the embodiment illustrated in FIG. 1, there is a cross-section view of a piezoelectric touch device, attached under the device surface 1 by double-sided adhesive 2. The piezoelectric touch device consists of a printed circuit board 5 having conductive layers 51 on top, which has inseparable section as a tongue 4 separated by opening 31 and connected to the printed circuit board 5 by a canvas 41 (not illustrated in the FIG. 1; embodiments illustrated in FIGS. 8 and 9). The tongue may be alternatively referred to as a bridge and although tongue is described in the embodiments a bridge design may be applied as well. Conductive layer 51 is attached the body of circuit board 5, typically FR4 material, and preferable flexible and 0.3-5 mm thick. The tongue 4 has one or more holes 6 throughout the tongue 4, and lower conductive layer 7. According to an embodiment, there are no holes in the piezo centre area in the conductive support structure such as in the conductive foil. According to an embodiment one large hole may be used. This conductive layer 7 is attached by conductive adhesive 8 to the piezoelectric element 20, which consists of piezoelectric ceramic layer 9 cemented to the metal disc 10. Metal disc is electrically connected to connection pads 7 by pressure provided a back support 15, which is attached to the printed circuit board 5 through its lower conductive layer 52 by adhesive 14. Connection pads 11 and 7 form an electrically connected circuitry either on same side (bottom side) of printed circuit board 5 or as illustrated in FIG. 2, different sides of printed circuit board 5 by via 43 connecting the connection pad 6 to upper conductive layer 44 of the tongue 4.

For each piezoelectric element 20 an independent routing to sensor and haptic actuation drive circuitries on printed circuit board 5 can be made. Details on driving the actuation signal to piezoelectric elements 20 are described elsewhere and it can be realized in the same or similar manner as is realized in the patent application WO2014128640. As an alternative embodiment the printed circuit board 5 having conductive layers 51 and 52 can be also replaced by a polymer film with screen printed conductive layers on both sides similar to layers 51 and 52. The printed circuit board or the polymer film may be more generally referred to as a conductive support structure, for example a conductive foil. Although embodiments are illustrated with respect to the printed circuit board 5, according to an embodiment the conductive foil may be used instead of the printed circuit board. The conductive adhesive 8 may also be liquid glue, and alternatively curable by UV or heat.

Figure 2:
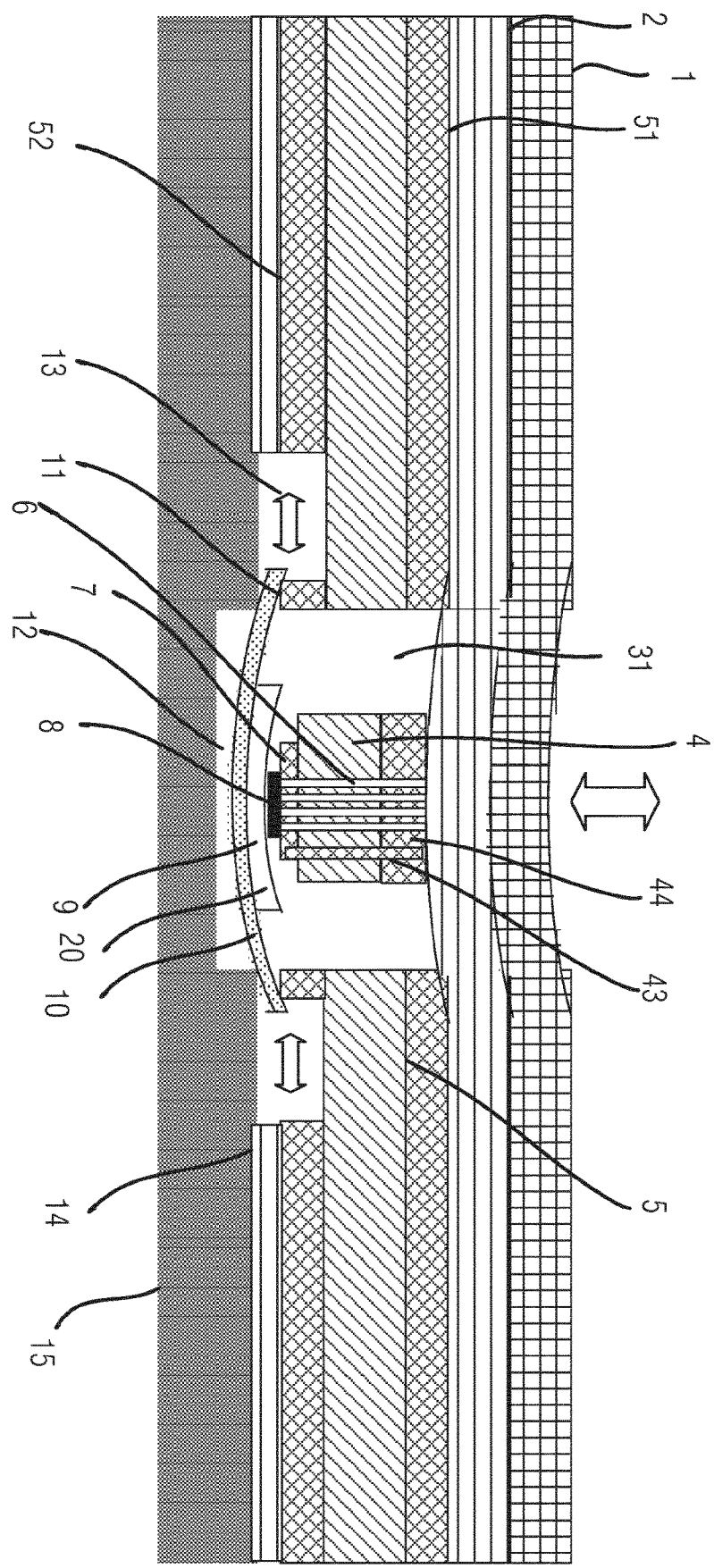
FIG. 2 illustrates a schematic representation of a bend stage for haptic feedback of a piezoelectric touch device according to the embodiment of FIG. 1.

In FIG. 2 there is the piezoelectric touch device in a bent stage according to an embodiment. Below the metal disc there is opening 12, which allows the piezoelectric element 20 to bend towards the opening 12. Bending is induced either by user applying pressure to the surface 1 or the active driving the charge to the piezoelectric element 20.

Next to connection pads 11 there is another opening 13, which allows also the edge the metal disc 10 to bend towards the device surface. As a result piezoelectric element 20 can effectively actuate without significant mechanical damping or clamping. The opening also 13 allows to use larger diameter disc 10 in piezoelectric element 20 in respect to the diameter of opening 12. The larger the disc diameter 9 is the more amplitude of haptic actuation is realized of piezoelectric element 20 as response to the drive signal.

Since the metal disc 10 is not firmly attached but gently or pressed between connection pad 7 and back support 15, the installation allows the disc to glide in transverse as indicated by arrow in opening 13 in FIG. 2, between the connection pad 11 and back support 15 and rotate around the pressed area by connection pad 7 and back support 15, without losing either electrical contact between pad and metal disc, nor mechanical contact between disc 10 and back support 15. By allowing the metal disc 10 gliding and rotating enables the piezoelectric element 20 to bend more and increase the haptic intensity in comparison of the configuration where connection between disc 10 and electrical pad 11 would be firmly attached.

Further FIG. 2 illustrates an embodiment how tongue 4 moves away from device surface 1 and pulling the surface downwards via adhesive layer 2 and thus effectively transmitting the movement of the piezoelectric element 20 to device surface 1. By driving active and highly controlled drive signal to piezoelectric element the different vibration patterns can be provided as haptic feedback.

As another embodiment the piezoelectric touch device may be configured in a manner that the piezoelectric element is in a bent stage without any additional pressure applied to device surface 1 or active drive signal to piezoelectric element. Especially for manufacturing is the configuration where, the connection pads 7, 11 and conductive layer 52 has identical thickness, and piezoelectric element has pre-pressure due to electrically conductive adhesive layer 8.

Figure 3:
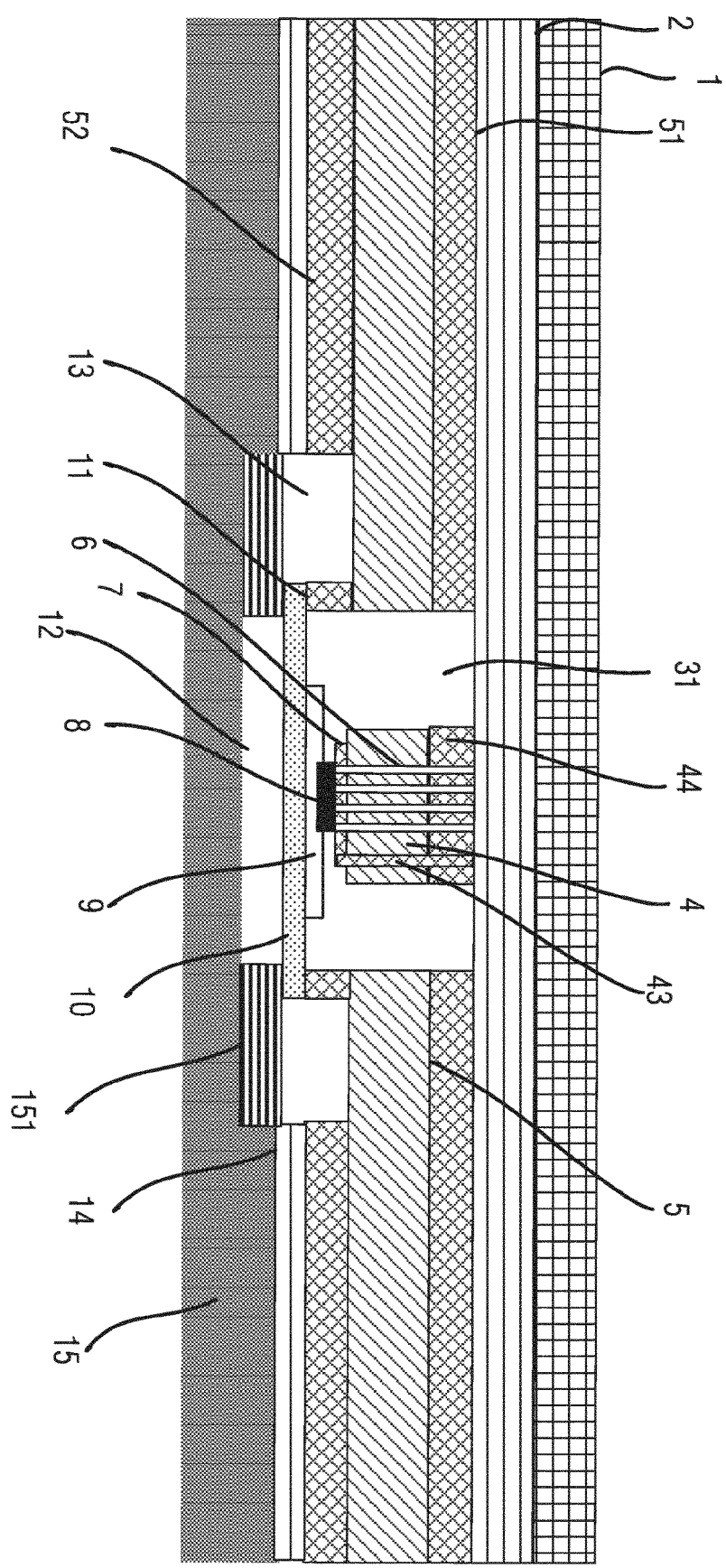
FIG. 3 illustrates a schematic representation of an elastic piezoelectric element support in a piezoelectric touch device according to an embodiment.

In FIG. 3 there is an embodiment illustrating another embodiment of the piezoelectric touch device by adding elastic support 151 under piezoelectric element 20. In actuation stage, where piezoelectric element 20 is bent downwards (as in FIGS. 2 and 4) elastic support 151 deforms further improving the bending characterizes of piezoelectric element in response to electrical driving signal and thus the intensity and quality of the tactile feedback in the device surface 1. As a result the vibration amplitude of device surface 1 increases and high frequency vibrations are damped, which results in a more silent haptic feedback. Also the elastic support 151 may partially relief the pre-pressure in a configuration where the pre-pressure would exist. Elastic material 151 is preferably but not limited to rubber or silicone.

Figure 4:
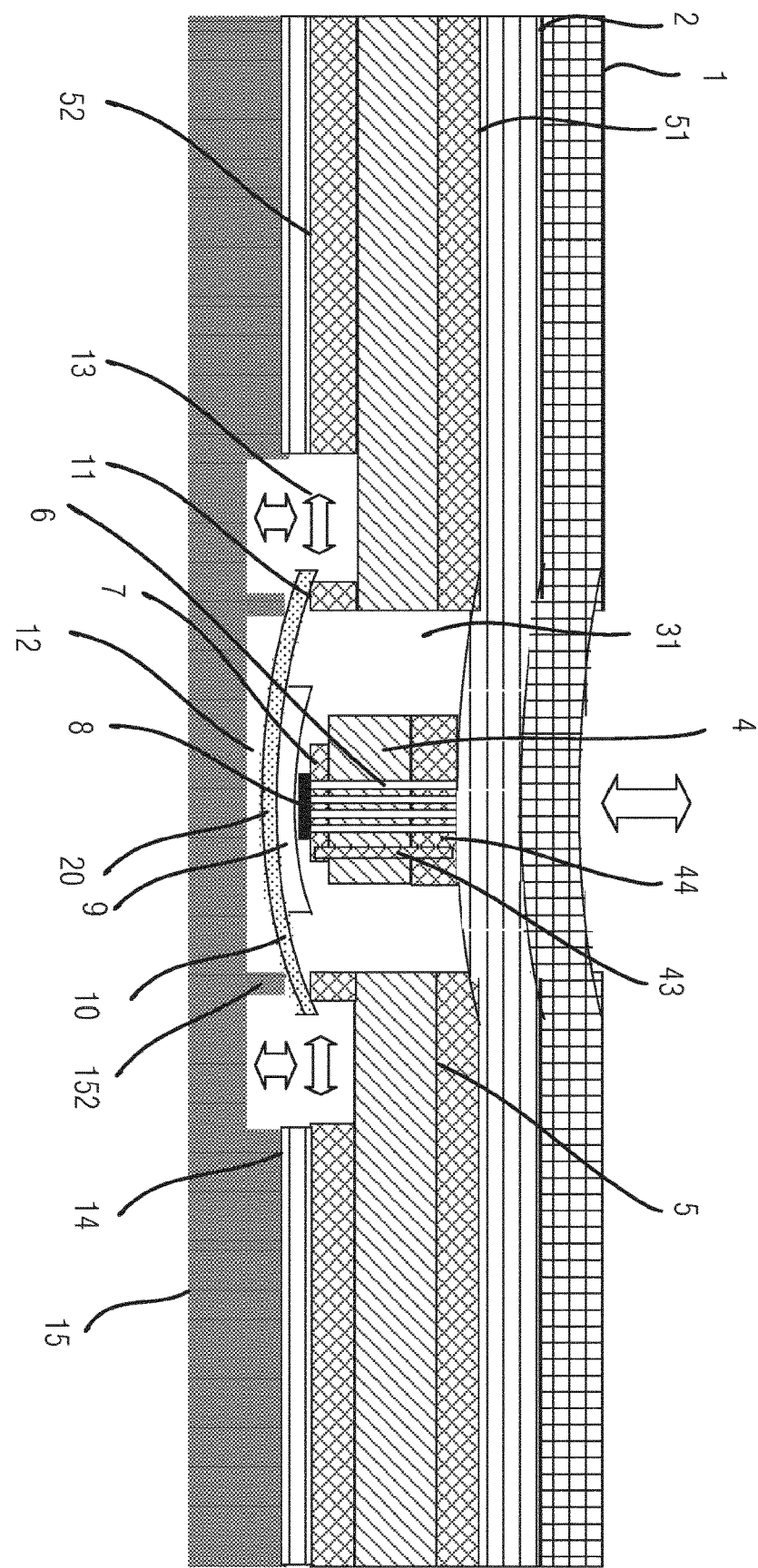
FIG. 4 illustrates a schematic representation of a configuration for a piezoelectric element support geometry in a piezoelectric touch device according to an embodiment.

In FIG. 4 there is an illustration of another embodiment of the piezoelectric touch device, where the back support 15 as on narrow support pad 152 in the manner that metal disc 10 is pressed between support pad 152 and connection 11 on adjacent side of the metal disc 10. This enables piezoelectric element to bend in both directions, downwards and upwards without significant losses of vibration energy to damping or clamping. The bidirectional actuation of piezoelectric element 20 may significantly increase the perceived haptic feedback intensity.

Figure 5:
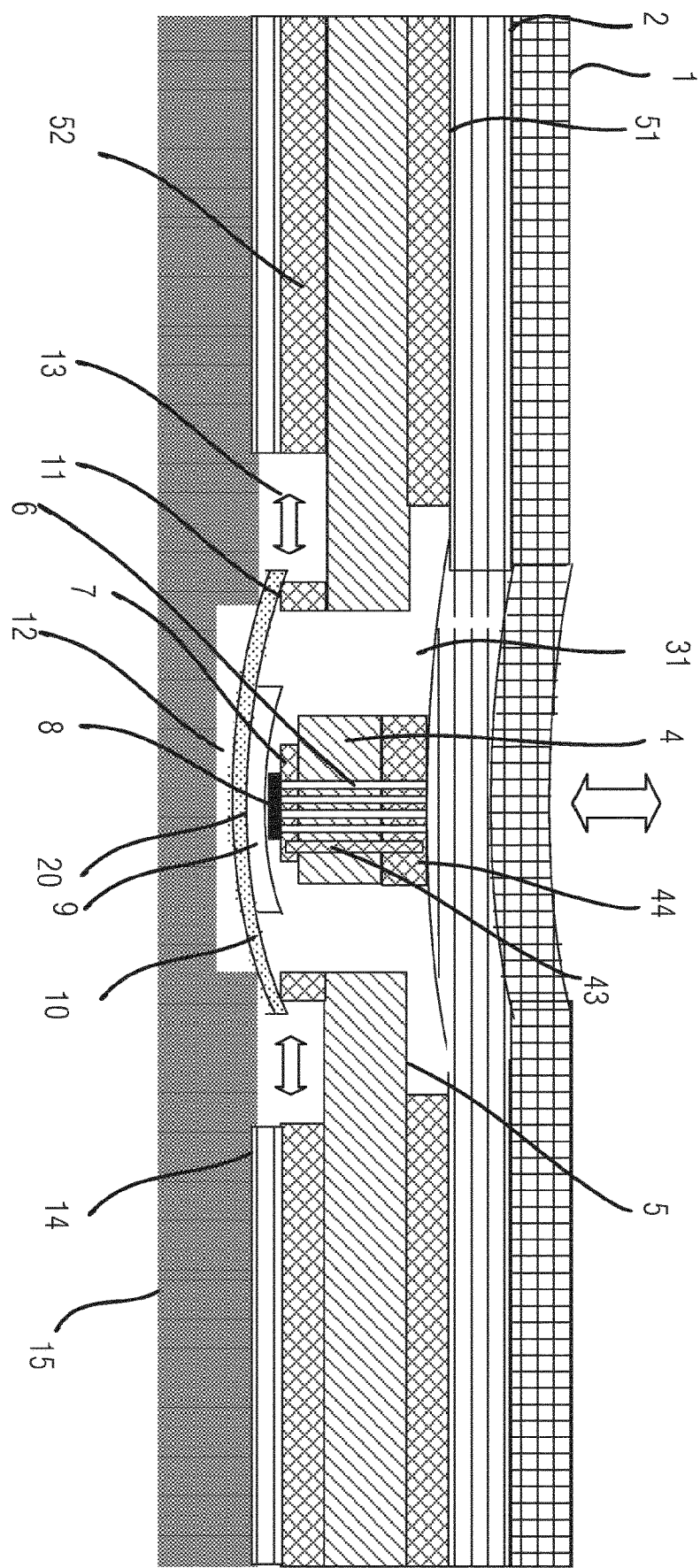
FIG. 5 illustrates a schematic representation of a printed circuit board design in a piezoelectric touch device according to an embodiment.

In FIG. 5 there is illustrated an embodiment, where the opening 31 has extended to the conductive layer 51 and whereas opening extension has larger diameter in comparison to opening 12. In this embodiment the tongue 4 can bend more freely in comparison to the embodiments shown in FIGS. 1-4, and thus increase the vibration efficiency of the piezoelectric touch device in respect to actuation of the piezoelectric element 20.

Figure 6:
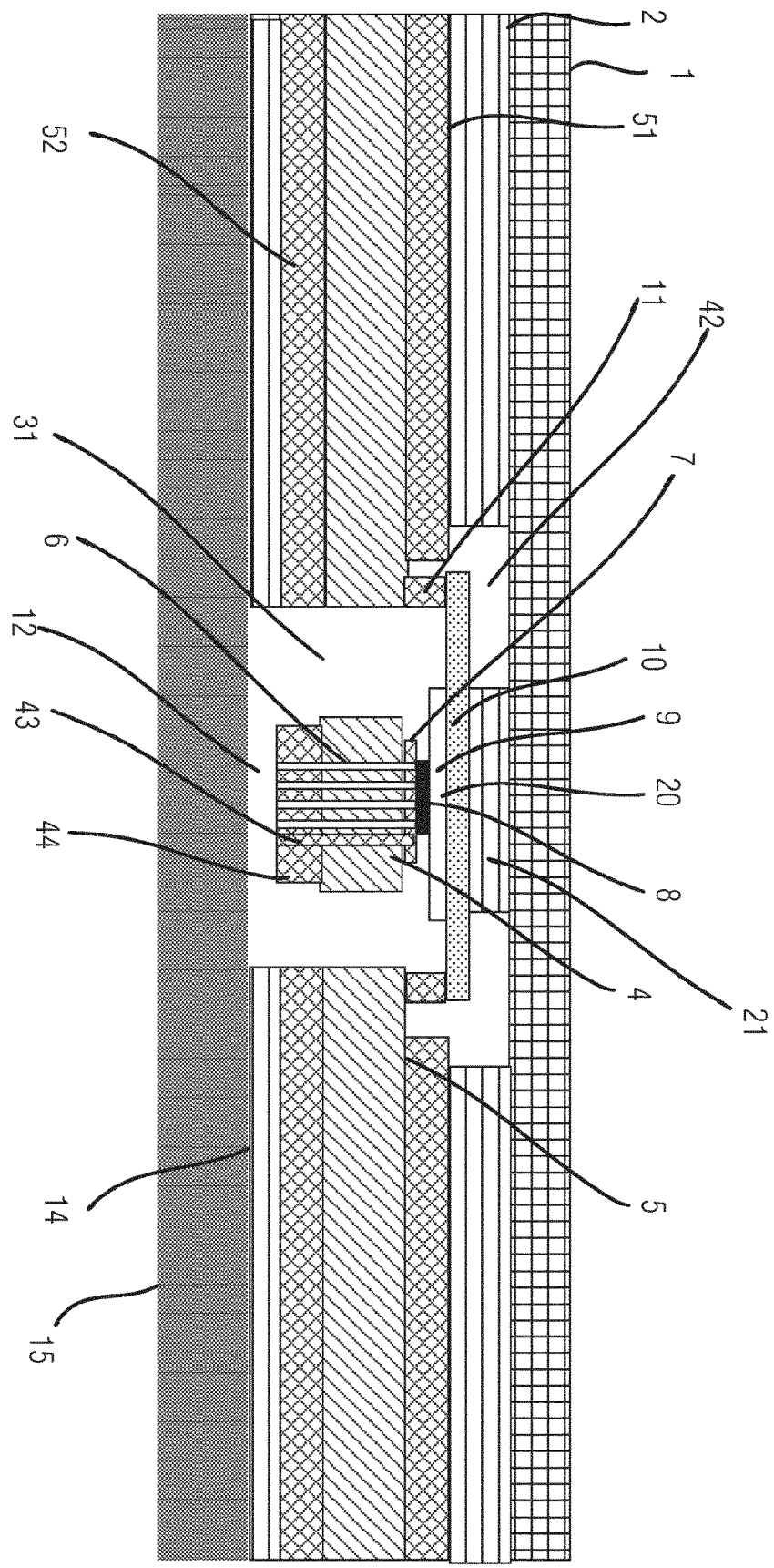
FIG. 6 illustrates a schematic representation of a piezoelectric element mounting in a piezoelectric touch device according to an embodiment.

In FIG. 6 there is another embodiment of the piezoelectric touch device. In this embodiment the piezoelectric sensor element 20 is between the device surface 1 and printed circuit board 5. In this configuration there is opening 42 in adhesive 2 allowing the metal disc to bend in similar manner as described earlier. Opening 42 can be also extended to conductive layer 51 (not illustrated in FIG. 6) to improve the bending characteristics of piezoelectric element 20 towards device surface 1, and thus improving the bi-directional bending properties of piezoelectric sensor element 20 in response to electrical drive signal for haptic feedback in similar manner as described in FIG. 4. Between the device surface 1 and metal disc 10 there is a separate adhesive layer 21 to attach the device surface 1 and the metal disc 10 of the piezoelectric element 20. It ensures the mechanical contact between the device surface 1 and the piezoelectric touch device. The surface area of adhesive layer 21 can be changed according to the bending properties of the device surface 1 and bending properties of the piezoelectric touch device. More specifically the surface area of adhesive layer 21 should be sufficiently large to ensure the mechanical contact, while piezoelectric element 20 is actuated by electrical signal in the manner the piezoelectric element 20 is producing its highest pulling force away from device surface 1. On the other hand the surface area of the adhesive layer 21 should be as small as possible to enable properly localized actuation area in the device surface 1, in a response the actuation of the piezoelectric element 20. And thirdly, to enable sufficient actuation movement downwards from device surface 1, the opening 42 should leave the distance between adhesive 2 and adhesive 21 as large as possible, such that the resistive supporting forces for downward bending of the device surface 1 is minimized.

Figure 7:
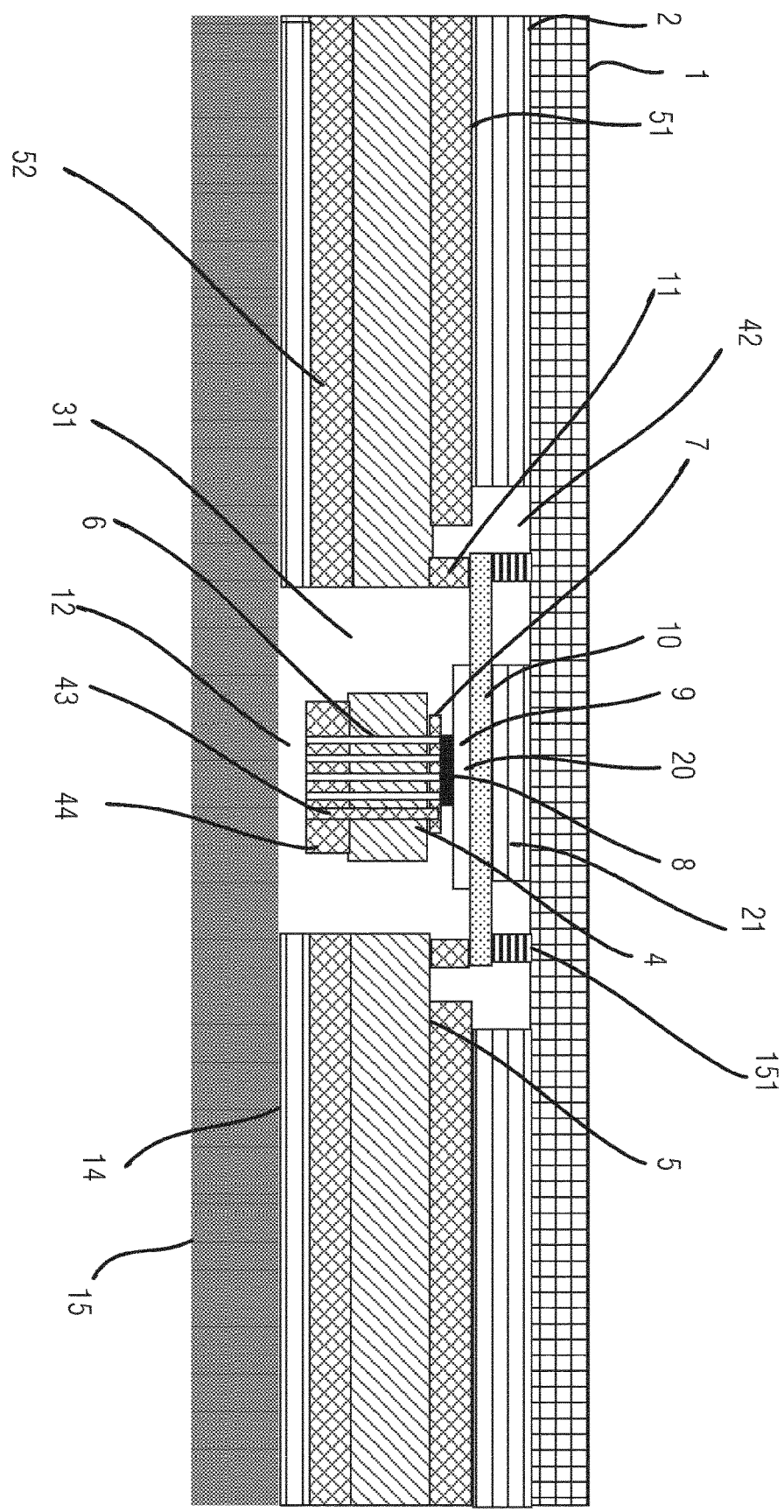
FIG. 7 illustrates a schematic representation of an elastic support of a piezoelectric element in a piezoelectric touch device according to an embodiment.

In FIG. 7 there is an illustration of another embodiment of the piezoelectric touch device, where there are elastic supports 151 added between the device surface 1 and metal disc 10 of the piezoelectric touch device in comparison to embodiment illustrated in FIG. 6. With these elastic supports 151 the similar effects may be achieved as in FIG. 3 for improving the haptic actuation of device surface 1.

There may also be an opening at the top adhesive (2), for example as illustrated in FIG. 7.

Figure 8:
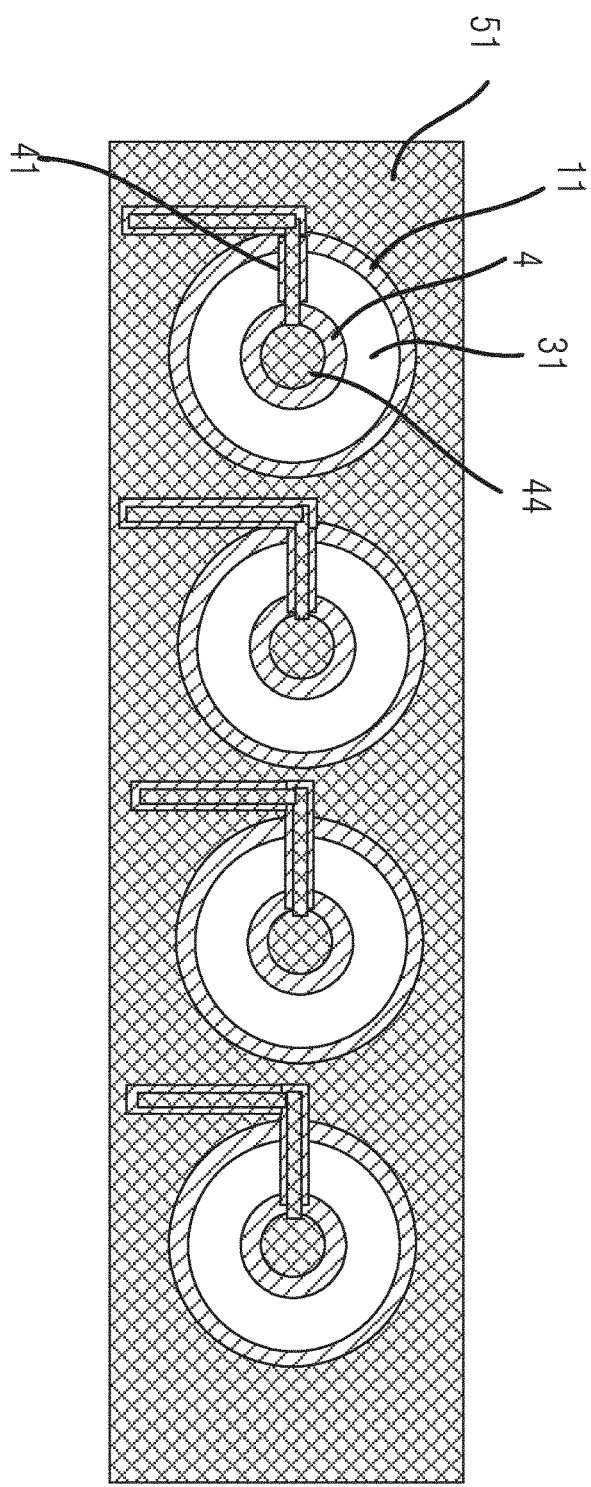
FIG. 8 illustrates a schematic representation of geometries of the opening and the tongue in a printed circuit board according to an embodiment.

In FIG. 8 there is an illustration of an embodiment illustrating a closer top view of printed circuit board 5 to enable efficient localized bending of piezoelectric element 20 to be mounted on it. The bridge is illustrated in FIG. 8. The thickness of the printed circuit 5 board may vary between 0,2 mm to 5 mm, and diameter of opening from 5-30 mm depending on the size and the pitch between multiple touch areas of the touch areas on the device surface 1. Diameter of connection pad 7 should be at least 1 mm but less than 20 mm depending on the configuration. The dimensions and number of canvases 41 may vary pending the mechanical properties of the piezoelectric touch device, piezoelectric element 20, and device surface 1.

In addition to the embodiment of FIG. 1 where a centric adhesion is illustrated, the piezoelectric element may be glued to the conductive support structure also at one point in the carrier plate edge. Furthermore, the conductive layer (51) on the top side of the conductive support structure may not be needed.

Figure 9:
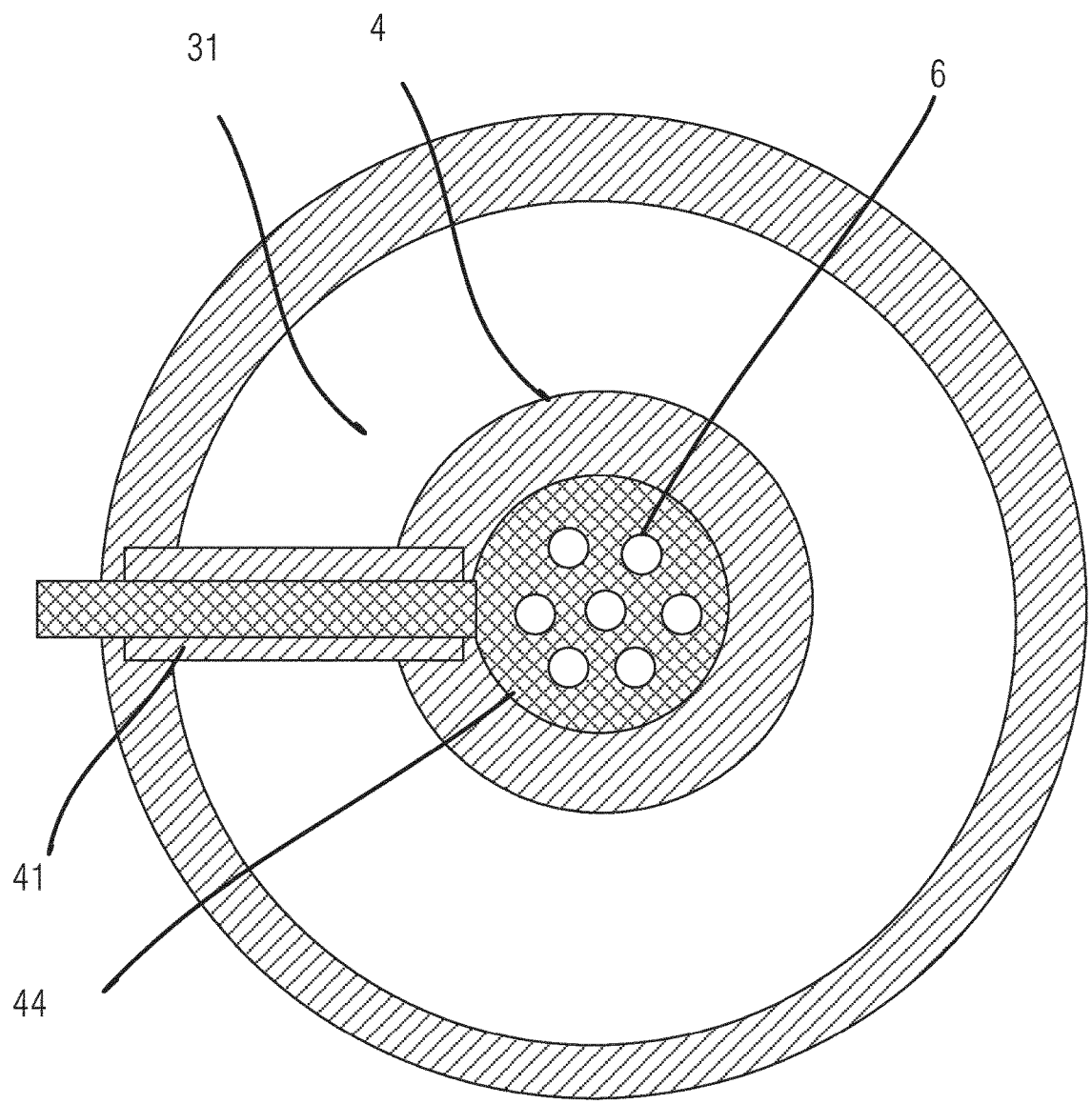
FIG. 9 illustrates a schematic representation of a close view of the opening and the tongue with holes in a printed circuit board according to an embodiment.

In FIG. 9 there is an illustration of an even closer top view of the tongue/bridge 4. Now the diameter and number of holes 6 throughout the tongue 4 in printed circuit board 5 can be chosen so that it maximized the adhesion by conductive adhesive 8. The holes 6 can be also be vias 43 providing same time electrical connection between conductive layers 7 and 44 through the printed circuit board 5 and improved adhesion.

More specifically the conductive adhesive 8 may consist of silver glue, which may be cured in heat step as part of the manufacturing by surface mounted technology. Prior to curing silver glue is in liquid format and it deposits on the area of conductive part (for example copper or gold plated copper) on the tongue, but also partly inside the holes 6. After solidification of the glue post to the heat step, the glue inside the holes increases the total contact area of the conductive adhesive 8 and the tongue 4 considerable, and thus enables strong adhesion. In other words with help of holes the smaller tongue surface area can be used, which results in more localized actuation of the device surface 1. Glue may be also cured without the heat step and different methods, resulting with same benefits as above.

The holes 6 does not necessarily need to be through holes of the tongue 4, but also they may be cavities in conductive area 7 of the tongue 4, which do not extend throughout the tongue 4. Or alternatively there are neither holes nor cavities on the conductive pad 7.

Figure 10:
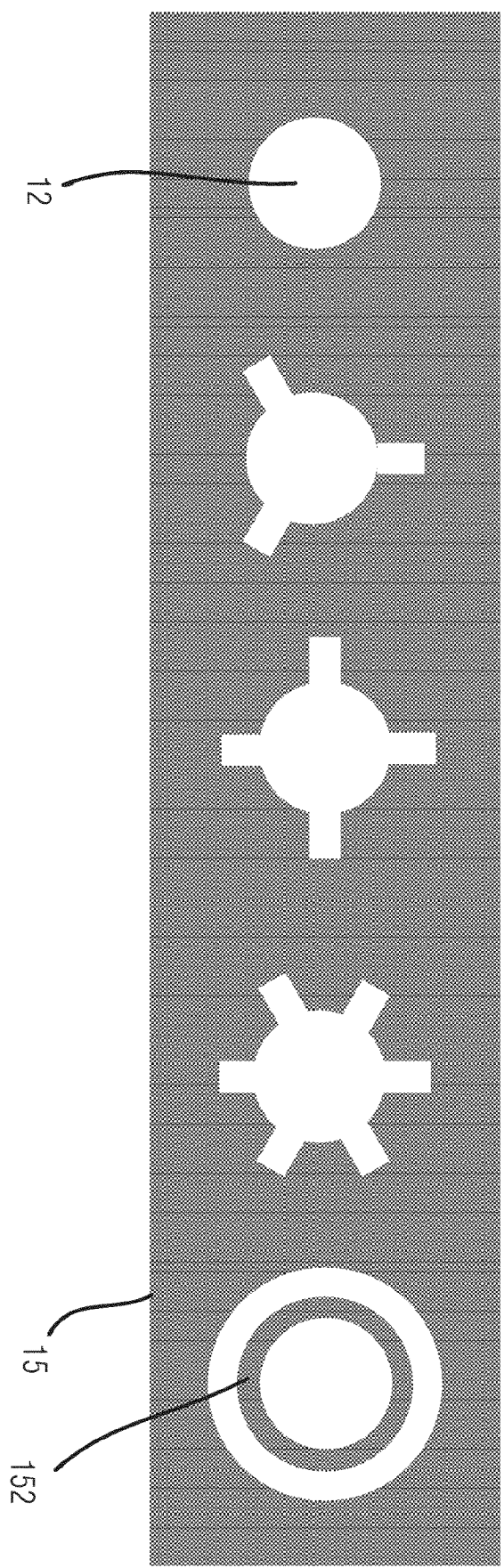
FIG. 10 illustrates a schematic representation of a back support with different openings geometries according to embodiments.

In FIG. 10 there is an embodiment illustrating the back support 15 with different opening geometries 12 to support piezoelectric element 20. The radial diameter of the opening should be slightly less than the diameter of metal disc 10 of the piezoelectric element 20 to provide support (typically 16-19 mm when disc diameter is 20 mm). In general the disc diameter may vary from 5-30 mm. In order to improve the bending properties of the piezoelectric element 20 in response to electrical drive signal, it is beneficial to add tongues radially distancing from main opening 12 as shown in the figure, which extend as radial distance beyond the diameter of the disc 10 of the piezoelectric element 20. Back support 15 may consist of rigid material as plastics and having total thickness of 1-20 mm, or alternatively back support 15 may be made of elastic material such as natural or silicone or plastic elastomers.

According to an embodiment the piezoelectric touch device may be configured to produce not only haptic feedback, but also audio feedback as a response of the touch detection of the same device. This enabled mainly the opening 12 between the metal disc 10 of the piezoelectric element 20 and the back support 15. When actuated as response the electrical drive signal, the piezoelectric element 20, may produce vibration within frequencies from 50 Hz up to several kilohertz range. Similarly to normal buzzer cavity design, the dimensions (diameter and depth) of the opening 12 in respect to the piezoelectric element 20 vibration properties may be chosen to provide enhanced audio output in selected frequency range, most preferably, but not limited to, in the range of 200 Hz-1 kHz. Also back support 15 may have holes to enable better sound output of the piezoelectric touch device as response to active drive signal to the piezoelectric element 20.

As another embodiment, the piezoelectric touch device may be configured to minimize the audio output as a result of actuation of the piezoelectric element 20. In this case, the design of opening 12 and choice of material for back support 15 is made in such manner that the audio frequencies are damped. Especially it is beneficial to avoid frequencies above 500 Hz.

Any range or device value given herein may be extended or altered without losing the effect sought. Also any embodiment may be combined with another embodiment unless explicitly disallowed.

Although the subject matter has been described in language specific to structural features and/or acts, it is to be understood that the subject matter defined in the appended claims is not necessarily limited to the specific features or acts described above. Rather, the specific features and acts described above are disclosed as examples of implementing the claims and other equivalent features and acts are intended to be within the scope of the claims.

It will be understood that the benefits and advantages described above may relate to one embodiment or may relate to several embodiments. The embodiments are not limited to those that solve any or all of the stated problems or those that have any or all of the stated benefits and advantages. It will further be understood that reference to 'an' item may refer to one or more of those items.

The steps of the methods described herein may be carried out in any suitable order, or simultaneously where appropriate. Additionally, individual blocks may be deleted from any of the methods without departing from the spirit and scope of the subject matter described herein. Aspects of any of the embodiments described above may be combined with aspects of any of the other embodiments described to form further embodiments without losing the effect sought.

The term 'comprising' is used herein to mean including the method, blocks or elements identified, but that such blocks or elements do not comprise an exclusive list and a method or apparatus may contain additional blocks or elements.

It will be understood that the above description is given by way of example only and that various modifications may be made by those skilled in the art. The above specification, examples and data provide a complete description of the structure and use of exemplary embodiments. Although various embodiments have been described above with a certain degree of particularity, or with reference to one or more individual embodiments, those skilled in the art could make numerous alterations to the disclosed embodiments without departing from the spirit or scope of this specification.

The invention claimed is:

1. A piezoelectric touch device, comprising:
   a conductive support structure comprising an inseparable section as a bridge separated by a first opening;
   a piezoelectric element configured to provide both a touch sensing and a haptic feedback;
   connection pads configured to form an electrically connected circuit for the piezoelectric element, wherein the piezoelectric element is electrically connected to the connection pads, and wherein the bridge comprises one of the connection pads and the conductive support structure comprises another of the connection pads, wherein the piezoelectric element is configured to slide in transverse with respect to the connection pads of the conductive support structure; wherein the piezoelectric element is further configured to provide the touch sensing and the haptic feedback based on a movement that is in transverse with respect to the slide; and
   a second opening next to the another of the connection pads allowing the piezoelectric element to bend freely.

2. The piezoelectric touch device according to claim 1, wherein the second opening comprises a lateral opening with respect to the piezoelectric element.

3. The piezoelectric touch device according to claim 1, wherein the connection pads are configured to both a mechanical support to the piezoelectric element and to the electric connection for electrically connect to the piezoelectric element.

4. The piezoelectric touch device according to claim 1, wherein the connection pads are configured on a same side of the piezoelectric element; or
   wherein the connection pads are configured on different sides of the piezoelectric element.

5. The piezoelectric touch device according to claim 1, further including a third opening configured to an opposite side of the piezoelectric element than the first opening.

6. The piezoelectric touch device according to claim 1, wherein dimensions of the piezoelectric element and openings are configured such that a piezoelectric element can be locally bent.

7. The piezoelectric touch device according to claim 1, wherein a diameter of the first opening is 5-30 millimetre.

8. The piezoelectric touch device according to claim 1, wherein the piezoelectric element is configured to also slide vertically with respect to the connection pads of the conductive support structure.

9. The piezoelectric touch device according to claim 1, wherein the piezoelectric element is configured in a bent stage without a pressure applied on a surface of the device or without a drive signal to the piezoelectric element.

10. The piezoelectric touch device according to claim 1, further including a back support configured to partly establish the first or the third opening; or
    wherein a back support is configured to provide a support to the piezoelectric element.

11. The piezoelectric touch device according to claim 1, wherein the support is configured elastic.

12. The piezoelectric touch device according to claim 1, wherein the piezoelectric element is electrically connected to the connection pads by a pressure provided by the back support.

13. The piezoelectric touch device according to claim 1, wherein a design of the openings is configured to effect an audio output; or
    wherein a material and/or design of the back support is configured to effect an audio output.

14. The piezoelectric touch device according to claim 1, wherein the conductive support structure comprises a conductive foil, a printed circuit board having conductive layers, or a polymer film having conductive layers.

15. The piezoelectric touch device according to claim 1, wherein the piezoelectric element comprises a piezoelectric layer and a conductive disk.

16. Method of manufacturing the piezoelectric touch device according to claim 1.

17. The method of manufacturing according to claim 16, wherein a surface mounted technology, a screen printing, UV curing or heat is used to manufacture piezoelectric touch device.

18. The piezoelectric touch device according to claim 1, wherein the piezoelectric element is not firmly attached to the connection pads of the conductive support structure.

19. The piezoelectric touch device according to claim 1, wherein at least one end of the piezoelectric element is configured to slide in transverse with respect to the connection pads of the conductive support structure.

* * * * *